US012326576B2

(12) United States Patent
Fu et al.

(10) Patent No.: US 12,326,576 B2
(45) Date of Patent: Jun. 10, 2025

(54) SPLICING DISPLAY UNIT AND DISPLAY SCREEN

(71) Applicants: Beijing BOE Display Technology Co., Ltd., Beijing (CN); BOE Technology Group Co., Ltd., Beijing (CN)

(72) Inventors: Changjia Fu, Beijing (CN); Enliang Zhang, Beijing (CN); Haijun Shi, Beijing (CN); Fei Dong, Beijing (CN); Wei Zhong, Beijing (CN); Xiaodi Sun, Beijing (CN); Qingshan Qu, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/767,740

(22) PCT Filed: Mar. 26, 2021

(86) PCT No.: PCT/CN2021/083428
§ 371 (c)(1),
(2) Date: Apr. 8, 2022

(87) PCT Pub. No.: WO2022/198679
PCT Pub. Date: Sep. 29, 2022

(65) Prior Publication Data
US 2024/0094442 A1 Mar. 21, 2024

(51) Int. Cl.
*G02B 3/00* (2006.01)
*G09F 9/302* (2006.01)
(52) U.S. Cl.
CPC ........ *G02B 3/00* (2013.01); *G02B 2003/0093* (2013.01); *G09F 9/3026* (2013.01)

(58) Field of Classification Search
CPC .. G02B 3/00; G02B 2003/0093; G09F 9/3026
(Continued)

(56) References Cited

U.S. PATENT DOCUMENTS

2006/0077544 A1 4/2006 Stark
2011/0102302 A1 5/2011 Watanabe et al.
(Continued)

FOREIGN PATENT DOCUMENTS

CN 101770732 A 7/2010
CN 102067196 A 5/2011
(Continued)

OTHER PUBLICATIONS

PCT/CN2021/083428 international search report.
(Continued)

*Primary Examiner* — Wyatt A Stoffa
*Assistant Examiner* — Mitchell T Oestreich
(74) *Attorney, Agent, or Firm* — IPro, PLLC

(57) ABSTRACT

The present application provides a splicing display unit and a display screen, in order to visually eliminate the seam, improve the user's visual effect on splicing screens, and achieve a subjective visual feeling for the user as if there was no seam. The display screen includes a plurality of display modules and a plurality of optical structures, the plurality of display modules and the plurality of optical structures being closely arranged; each of the display modules includes a display area and a black edge area arranged around the display area, black edge areas of adjacent two display modules are spliced together to form a seam; one end of the first surface of the optical structure close to the seam is a first arc surface, and the first arc surface is configured to refract light emitted from the display area of the display module, and then distribute the refracted light in a front-view area corresponding to the seam.

18 Claims, 13 Drawing Sheets

(58) Field of Classification Search
USPC .......................................................... 359/642
See application file for complete search history.

(56) References Cited

U.S. PATENT DOCUMENTS

2011/0109535 A1    5/2011  Watanabe et al.
2014/0071657 A1*   3/2014  Sekiguchi ........... G02F 1/13336
                                                        362/97.1

FOREIGN PATENT DOCUMENTS

| CN | 102067197 A | 5/2011 |
| CN | 103903518 A | 7/2014 |
| CN | 203689856 U | 7/2014 |
| CN | 104123885 A | 10/2014 |
| CN | 204375351 U | 6/2015 |
| CN | 105448196 A | 3/2016 |
| CN | 205845413 U | 12/2016 |
| CN | 207165134 U | 3/2018 |
| CN | 108564894 A | 9/2018 |
| CN | 110456552 A | 11/2019 |
| CN | 210924147 U | 7/2020 |
| JP | 2004524551 A | 8/2004 |
| JP | 2012215886 A | 11/2012 |
| JP | 2014002328 A | 1/2014 |
| KR | 20150031623 A | 3/2015 |
| WO | 2009157150 A1 | 12/2009 |
| WO | 2011001933 A1 | 1/2011 |

OTHER PUBLICATIONS

PCT/CN2021/083428 Written Opinion.
EP219322989 extended European search report.
CN202180000614.8 first office action dated Oct. 31, 2024.
JP2022-573355 first office action dated Jan. 14, 2025.
JP 2022-573355 second office action dated Apr. 15, 2025.

* cited by examiner

SPLICING DISPLAY UNIT AND DISPLAY SCREEN

CROSS-REFERENCE TO RELATED APPLICATIONS

The present application is a U.S. National Phase of International Application No. PCT/CN2021/083428, entitled "SPLICING DISPLAY UNIT AND DISPLAY SCREEN", and filed on Mar. 26, 2021. The entire contents of each of the above-listed applications are hereby incorporated by reference for all purposes.

TECHNICAL FIELD

The present disclosure relates to the field of display technologies, and in particular to a splicing display unit and a display screen.

BACKGROUND

With the increasing demands of the market and users, video walls (splicing screens) are constantly pursuing extremely narrow borders to achieve a better visual experience. However, due to the structure of sealing and encapsulating liquid crystals on the LCD screen, the black matrix on the edge and the technical limitations of the sealing area, black lines on the edges of the screen cannot be completely eliminated, and there will be an apparent black line, that is, a seam, after splicing screens, as shown in the B area in FIG. 1, which will seriously affect the visual effect of the user watching a displayed image.

Therefore, how to improve the user's visual effect and achieve a subjective visual feeling for the user as if there was no seam is a technical problem to be solved urgently in this field.

SUMMARY

The present disclosure provides an array substrate and a splicing display unit and a display screen, which can visually eliminate the seam, improve the user's visual effect on splicing screens, and achieve a subjective visual feeling for the user as if there was no seam.

According to a first aspect of the embodiments of the present disclosure, there is provided a display screen, including a plurality of display modules and a plurality of optical structures, the plurality of display modules and the plurality of optical structures being closely arranged, wherein each of the optical structures is arranged corresponding to one of the display modules, and is arranged on a side of a light-emitting surface of the display module; adjacent two display modules are arranged close to each other, and optical structures on adjacent two display modules are arranged close to each other;

each of the display modules includes a display area and a black edge area arranged around the display area, black edge areas of adjacent two display modules are spliced together to form a seam;

each of the optical structures includes a first surface and a second surface disposed opposite to each other, and the second surface of the optical structure is attached to the display module;

one end of the first surface of the optical structure close to the seam is a first arc surface, and the first arc surface is configured to refract light emitted from the display area of the display module, and then distribute the refracted light in a front-view area corresponding to the seam.

Optionally, the first arc surface is a convex arc surface configuration.

Optionally, a size of an orthographic projection of the first arc surface on the display module along a width direction of the seam is larger than or equal to a width of the seam, and smaller than or equal to the width of the seam 30 plus 5 mm, and the width of the seam is 0.88 mm-3.9 mm; and/or, the first arc surface includes a first end close to the display module and a second end away from the display module; a distance from a horizontal plane where the first end of the first arc surface is located to a horizontal plane where the second end of the first arc surface is located is smaller than or equal to one half of a thickness of the optical structure; and/or a radius of the first arc surface is larger than or equal to the width of the seam, and smaller than or equal to the width of the seam plus 5 mm, where the width of the seam is 0.88 mm-3.9 mm; and/or, the radius of the first arc surface is 2 mm-5 mm; and/or, a thickness of the optical structure is 3 mm-10 mm.

Optionally, one end of the second surface of the optical structure close to the seam is a second arc surface, and light emitted from the display area of the display module is reflected by the second arc surface to supplement light in a non-front-view area corresponding to the seam.

Optionally, the second arc surface is a concave arc surface configuration.

Optionally, the second arc surface includes a third end close to the display module and a fourth end away from the display module; a distance from a horizontal plane where the fourth end is located to a horizontal plane where the third end is located is larger than or equal to one half of the width of the seam and smaller than or equal to the thickness of the optical structure minus 1 mm; and/or, a distance between one end of the first arc surface closest to the second surface and one end of the second arc surface closest to the first surface is larger than or equal to 0.3 mm, and smaller than or equal to 1 mm; and/or, a radius of the second arc surface is 2 mm-8 mm.

According to a second aspect of the embodiments of the present disclosure, there is provided a splicing display unit, including a display module and an optical structure, the display module and the optical structure being stacked together, wherein the optical structure is arranged on one side of a light emitting surface of the display module;

the display module includes a display area and a black edge area arranged around the display area;

each optical structure includes a first surface and a second surface disposed opposite to each other, and the second surface of the optical structure is attached to the display module;

one end of the first surface of the optical structure close to the black edge area of the display module is a first arc surface, and the first arc surface is configured to refract light emitted from the display area of the display module and distribute the refracted light in a front-view area corresponding to the black edge area.

Optionally, the first arc surface is a convex arc surface configuration.

Optionally, a size of an orthographic projection of the first arc surface on the display module along a width direction of the black edge area is larger than or equal to twice a width of the black edge area and smaller than or equal to twice the width of the black edge area plus 5 mm, and the width of the black edge area is 0.44 mm-1.95 mm; and/or, the first arc surface includes a first end close to the display module and a second end away from the display module; a distance from a horizontal plane where the first end of the first arc surface is located to a horizontal plane where the second end of the first arc surface is located is smaller than or equal to one half of a thickness of the optical structure; and/or, a radius of the first arc surface is larger than or equal to twice the width of the black edge area, and smaller than or equal to twice the width of the black edge area plus 5 mm, the width of the black edge area is 0.44 mm-1.95 mm; and/or, the radius of the first arc surface is 2 mm-5 mm; and/or;

a thickness of the optical structure is 3 mm-10 mm.

Optionally, one end of the second surface of the optical structure close to the black edge area of the display module is a second arc surface, and light emitted from the display area of the display module is reflected by the second arc surface to supplement light in a non-front-view area corresponding to the black edge area.

Optionally, the second arc surface is a concave arc surface configuration.

Optionally, the second arc surface includes a third end close to the display module and a fourth end away from the display module; a distance from a horizontal plane where the fourth end is located to a horizontal plane where the third end is located is larger than or equal to the width of the black edge area and smaller than or equal to the thickness of the optical structure minus 1 mm, and the width of the black edge area is 0.44 mm-1.95 mm; and/or, a distance between one end of the first arc surface closest to the second surface and one end of the second arc surface closest to the first surface is larger than or equal to 0.3 mm, and smaller than or equal to 1 mm; and/or, a radius of the second arc surface is 2 mm-8 mm.

In the display screen of the present disclosure, by providing the overall structure and providing the first arc surface in the optical structure, the light emitted from the display area of the display module can be refracted and distributed in the front-view area corresponding to the seam, which can visually eliminate the seam, improve the user's visual effect on splicing screens, and achieve a subjective visual feeling for the user as if there was no seam.

In the splicing display unit of the present disclosure, by providing the overall structure and providing the first arc surface in the optical structure, the light emitted from the display area of the display module can be refracted and distributed in the front-view area corresponding to the black edge area, which can visually eliminate the black edge area, improve the user's visual effect on splicing screens, and achieve a subjective visual feeling for the user as if there was no black edge area.

DETAILED DESCRIPTION OF THE EMBODIMENTS

Figure 1:
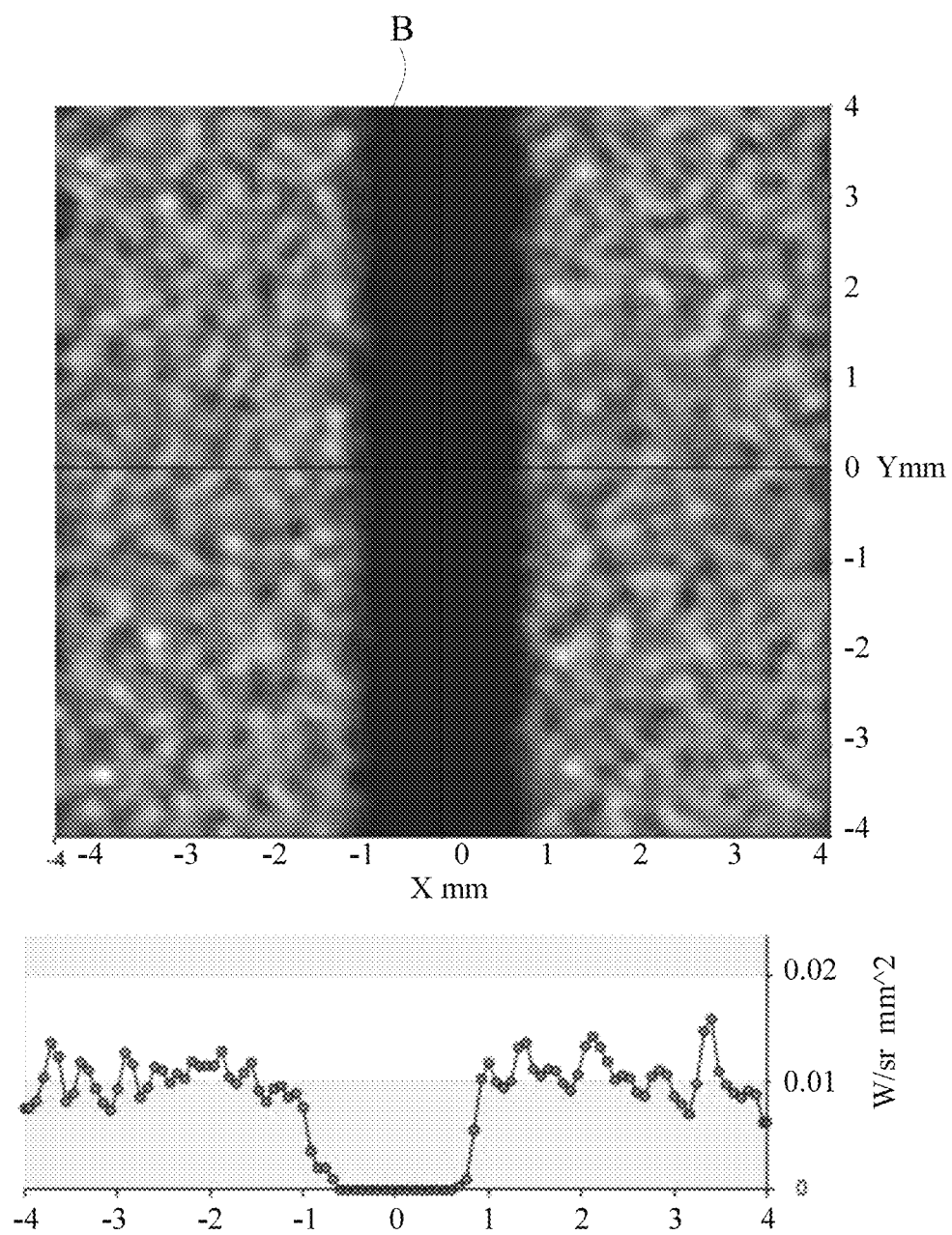
FIG. 1 is a front view of a simulated luminance distribution diagram of a display screen in the prior art.

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular examples only, and are not intended to limit the present disclosure. Unless otherwise defined, technical or scientific terms used in this application shall have the ordinary meaning as understood by those of ordinary skill in the art to which this application belongs. Terms determined by "a" or "an" used in the specification and claims of this application also do not denote a quantitative limitation, but rather denote the presence of at least one. Terms like "comprise" or "include" mean that the elements or items appearing before "comprising" or "including" cover the elements or items listed after "comprising" or "including" and their equivalents, and do not exclude other elements or objects. "Connected to" or "connected with" and similar words are not limited to physical or mechanical connections, but can include electrical connections, whether direct or indirect. "A plurality of" includes two, equivalent to at least two. As used in this specification and the appended claims, the singular forms "a," "an," and "the" are intended to include the plural forms as well, unless the context clearly dictates otherwise. It will also be understood that the term "and/or" as used herein refers to and includes any and all possible combinations of one or more of the associated listed items.

Example 1

Figure 2:
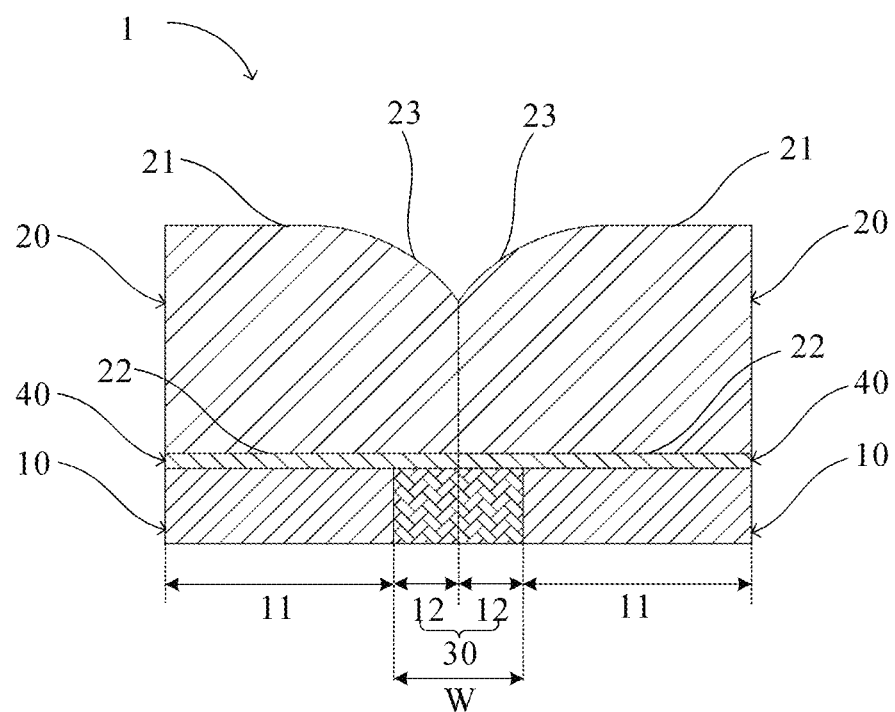
FIG. 2 is a partial cross-sectional view of a display screen of Example 1 of the present application.
Figure 3:
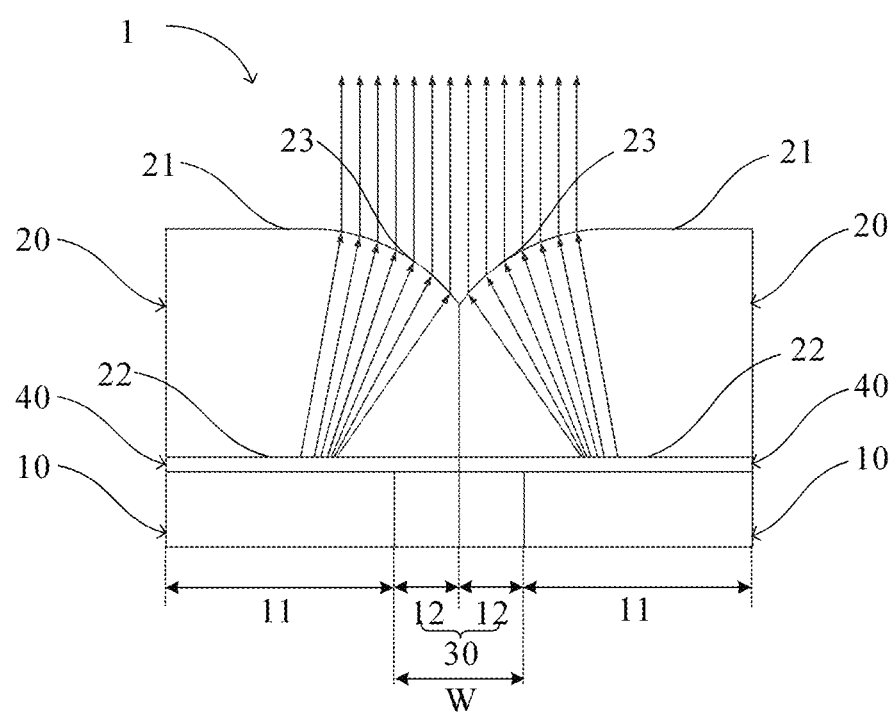
FIG. 3 is a schematic diagram of a light path of light emitted by the display module of the display screen of Example 1 of the present application.
Figure 4:
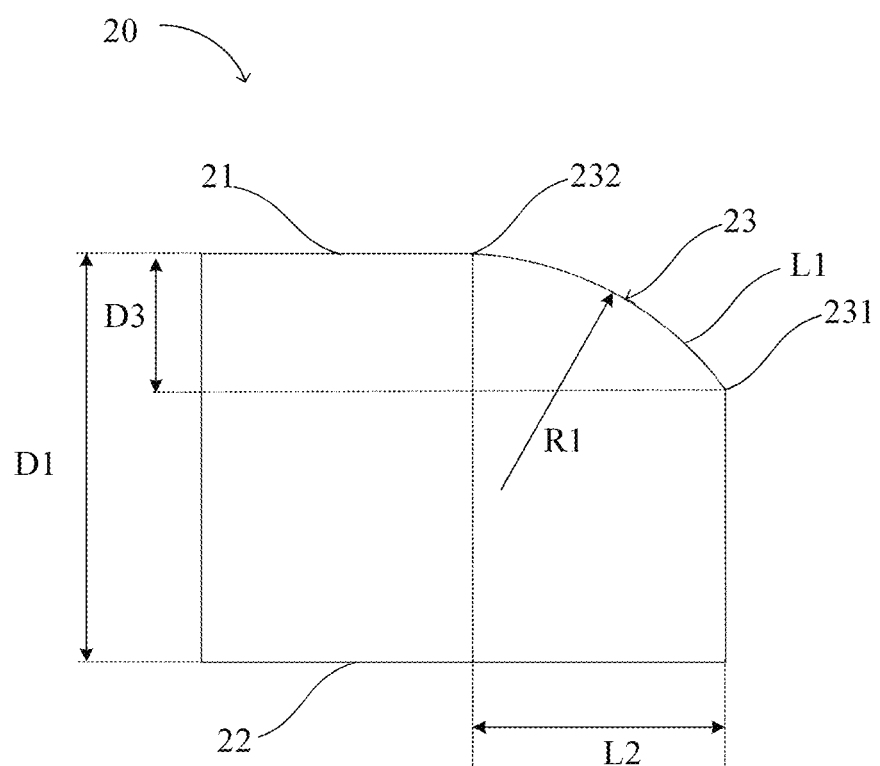
FIG. 4 is a partial cross-sectional view of an optical structure of the display screen of Example 1 of the present application.

As shown in FIG. 2 to FIG. 4, this example provides a display screen 1. The display screen 1 includes a plurality of display modules 10 and a plurality of optical structures 20, the plurality of display modules and the plurality of optical structures being closely arranged. Each of the optical structures 20 is arranged corresponding to one of the display modules 10 and is arranged on a side of a light-emitting surface of the display module 10. Adjacent two display modules 10 are arranged close to each other, and optical structures 20 on adjacent two display modules 10 are arranged close to each other.

Each of the display modules 10 includes a display area 11 and a black edge area 12 arranged around the display area 11, that is, the display area 11 is located at the center of the display module, and the black edge area 12 is arranged around the display area 11, and located at the edge of the display module. Black edge areas 12 of adjacent two display modules 10 are spliced together to form a seam 30.

Each of the optical structures 20 includes a first surface 21 and a second surface 22 disposed opposite to each other, and the second surface 22 of the optical structure 20 is attached to the display module 10.

One end of the first surface 21 of the optical structure 20 close to the seam 30 is a first arc surface 23, and the first arc surface 23 is configured to refract light emitted from the display area 11 of the display module 10 and then distribute the refracted light to a front-view area corresponding to the seam 30. As shown in FIG. 2, the direction of the arrow in the figure is a propagation direction of the light emitted from the display area 11 of the display module 10. In order to more clearly show the propagation direction of the light emitted from the display area 11 of the display module 10, a cross section line is removed from the figure.

It should be noted that the front-view area corresponding to the seam 30 refers to that an area where the seam 30 is observed when a user watches the display module 10 from a front view angle (i.e., an angle perpendicular to the display module 10) in absence of an optical structure.

In this way, by providing the overall structure and providing the first arc surface 23 in the optical structure 20, the light emitted from the display area 11 of the display module 10 can be refracted and distributed in the front-view area corresponding to the seam 30, which can visually eliminate the seam 30, improve the user's visual effect on splicing screens, and achieve a subjective visual feeling for the user as if there was no seam 30. Specifically, the light is refracted by the first arc surface 23 of the optical structure 20, so that the display area 11 of the display module 10 is "enlarged" to the imaging surface, so as to achieve the visual effect as if the physical seam 30 of the display screen 1 was eliminated.

Further, the first arc surface 23 is a convex arc surface configuration. The convex arc surface configuration refers to that the arc surface is convex in a direction away from the center of the optical structure. And the end surface of the first arc surface 23 is located within the edge of the optical structure 20.

That is to say, the first arc surface 23 extends from a plane where the first surface 21 is located toward a direction close to the display module 10 to form a convex arc surface configuration, thereby forming a structure similar to a convex lens, to implement refracting the light emitted from the display area 11 of the module 10 and distributing the refracted light in the front-view area corresponding to the seam 30. Further, by defining parameters of the structure of the convex lens, it is possible to make the optical path to be deviated from the incident light direction by a specific angle to achieve an effect of magnifying an image, thereby eliminating the seam 30 and improving the user experience.

In addition, compared with some optical structures 20 in the prior art that are formed by overlapping several groups of prism structures, and the technical solutions in which several groups of prism structures are arranged to translate the image to the area of the seam 30, the optical structure 20 of the display screen 1 of this example has an image magnification effect, which can be suitable for N*N splicing, and is a single structure, so as to avoid the change of the picture effect caused by offsets of multiple structures in assembling.

Specifically, as shown in FIG. 3, in order to more clearly show the arrangement of the first arc surface 23 in the optical structure 20, the cross section line in the figure is removed. A size L2 of an orthographic projection of the first arc surface 23 on the display module 10 along the width direction of the seam 30 is larger than or equal to the width W of the seam 30, and smaller than or equal to the width W of the seam 30 plus 5 mm. The width W of the seam 30 is 0.88 mm-3.9 mm. By making the size L2 of the orthographic projection of the first arc surface 23 on the display module 10 along the width direction of the seam 30 to be larger than or equal to the width W of the seam 30, it is possible to block the seam 30, but if the size is too large, the effect of refraction will be reduced.

The first arc surface 23 includes a first end 231 close to the display module 10 and a second end 232 away from the display module 10. A distance D3 from a horizontal plane where the first end 231 of the first arc surface 23 is located to a horizontal plane where the second end 232 of the first arc surface 23 is located is smaller than or equal to one half of a thickness D1 of the optical structure 20. Within this range, the larger the value of the distance D3 from the horizontal plane where the first end 231 of the first arc surface 23 is located to the horizontal plane where the second end 232 of the first arc surface 23 is located, the better the refraction effect and the better the front view effect, but the larger thickness of the optical structure will increase the weight and material cost; which will be traded off during design. Preferably, the distance D3 from the horizontal plane where the first end 231 of the first arc surface 23 is located to the horizontal plane where the second end 232 of the first arc surface 23 is located is 2 mm-4 mm.

A radius R1 of the first arc surface 23 is larger than or equal to the width W of the seam 30, and smaller than or equal to the width W of the seam 30 plus 5 mm. Preferably, the radius R1 of the first arc surface 23 is 2 mm-5 mm.

The arc length L1 of the first arc surface 23 is defined collectively by the size L2 of the orthographic projection of the first arc surface 23 on the display module 10 along the width direction of the seam 30, the distance D3 from the horizontal plane where the first end 231 of the first arc surface 23 is located to the horizontal plane where the second end 232 of the first arc surface 23 is located and the radius R1 of the first arc surface 23. The larger the arc length L1 of the first arc surface 23 is, the larger the length of the seam that can be covered is, which can be designed based on the length of the seam.

In this example, a thickness D1 of the optical structure 20 is 3 mm-10 mm. The material of the optical structure 20 is glass, or PMMA (polymethyl methacrylate), or PC (polycarbonate). The optical structure 20 is fixed on the display module 10 through an optical adhesive layer 40.

In this example, the second surface 22 of the optical structure 20 in this example is an integral flat plane.

Figure 5:
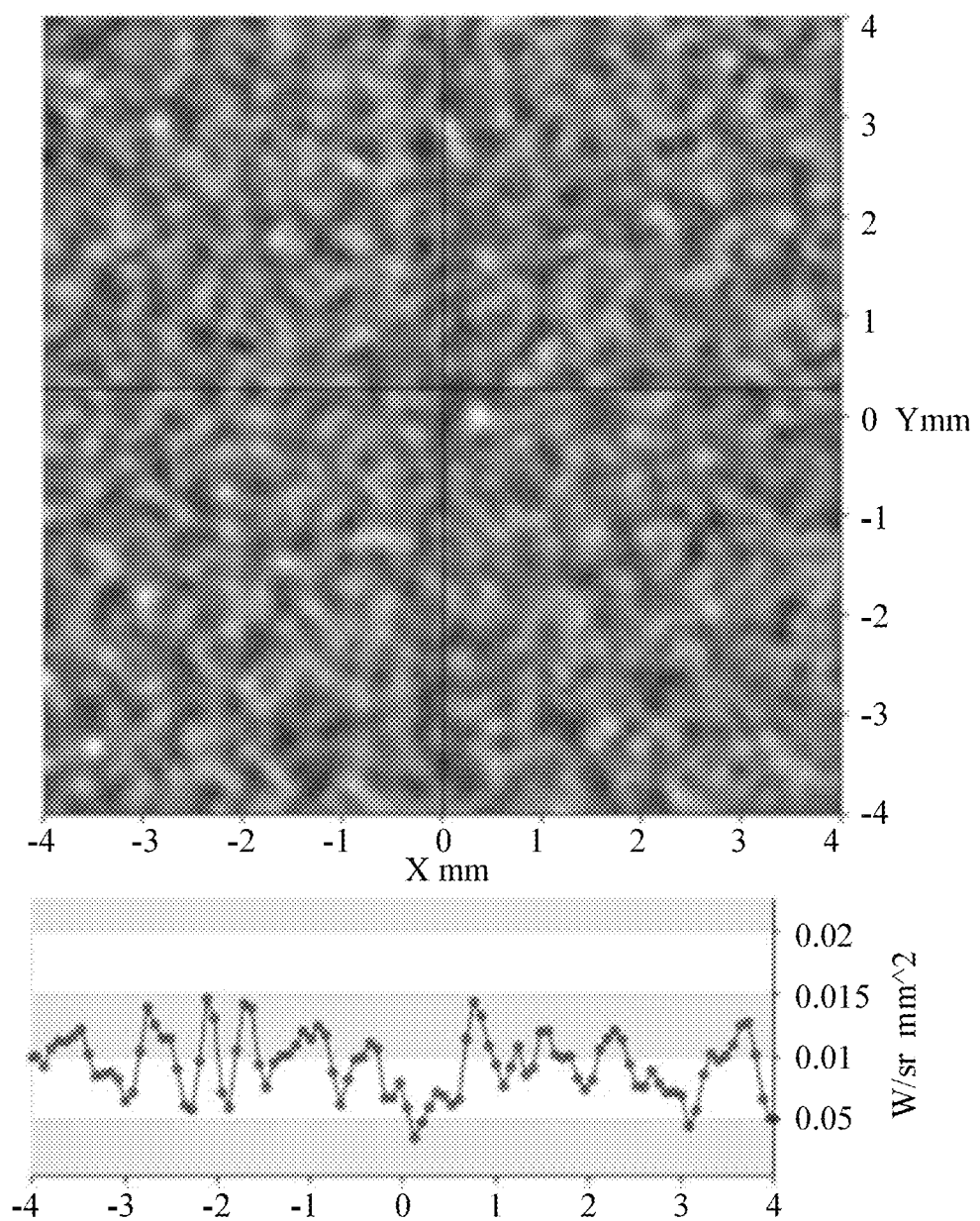
FIG. 5 is a front view of a simulated luminance distribution diagram of the display screen of Example 1 of the present application.
Figure 6:
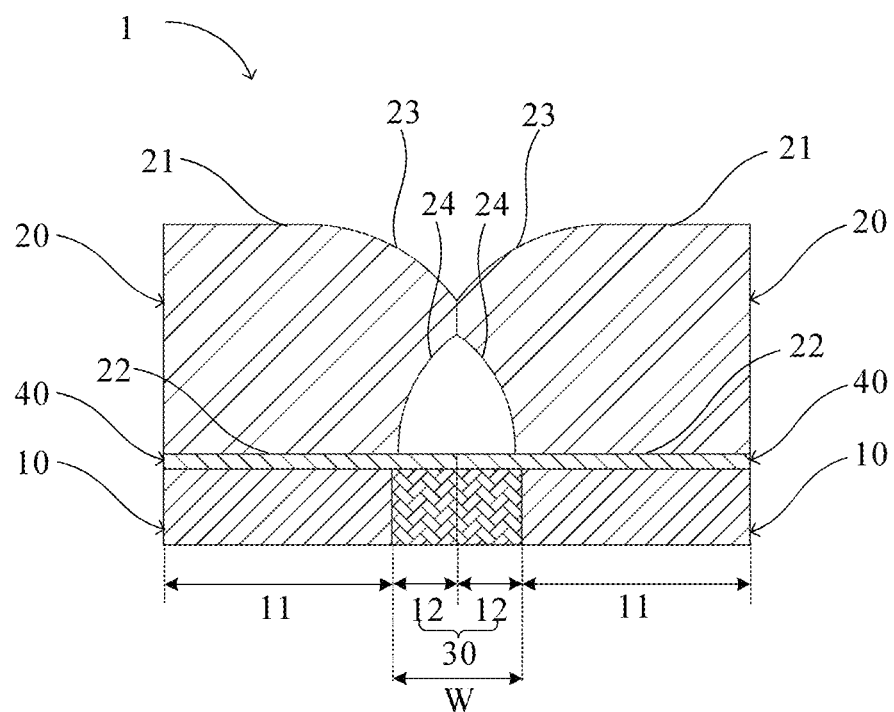
FIG. 6 is a partial cross-sectional view of a display screen of Example 2 of the present application.
Figure 7:
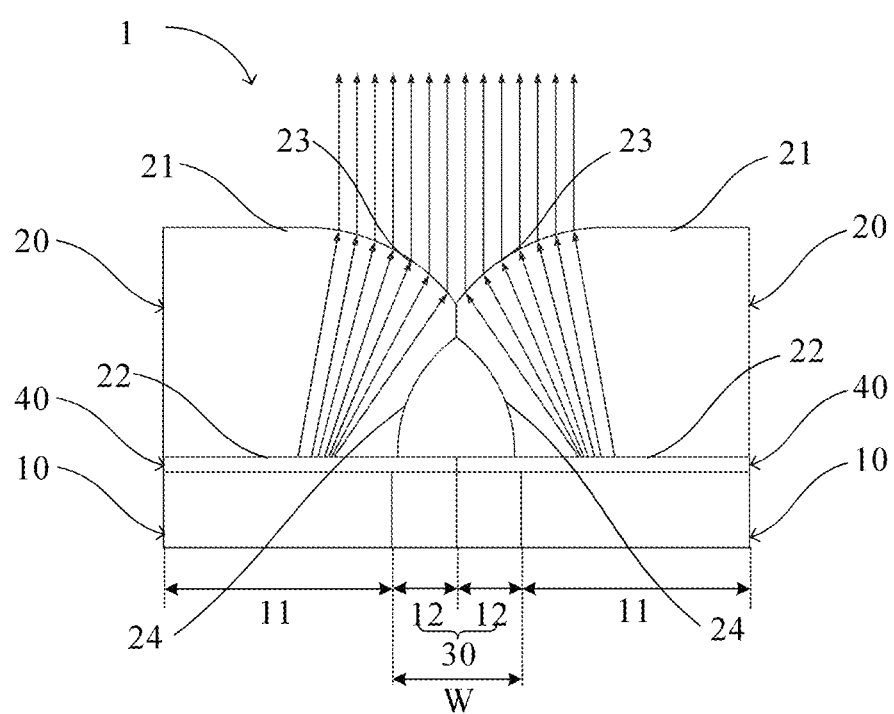
FIG. 7 is a schematic diagram of an optical path of light emitted by a display module of a display screen of Example 2 of the present application.
Figure 8:
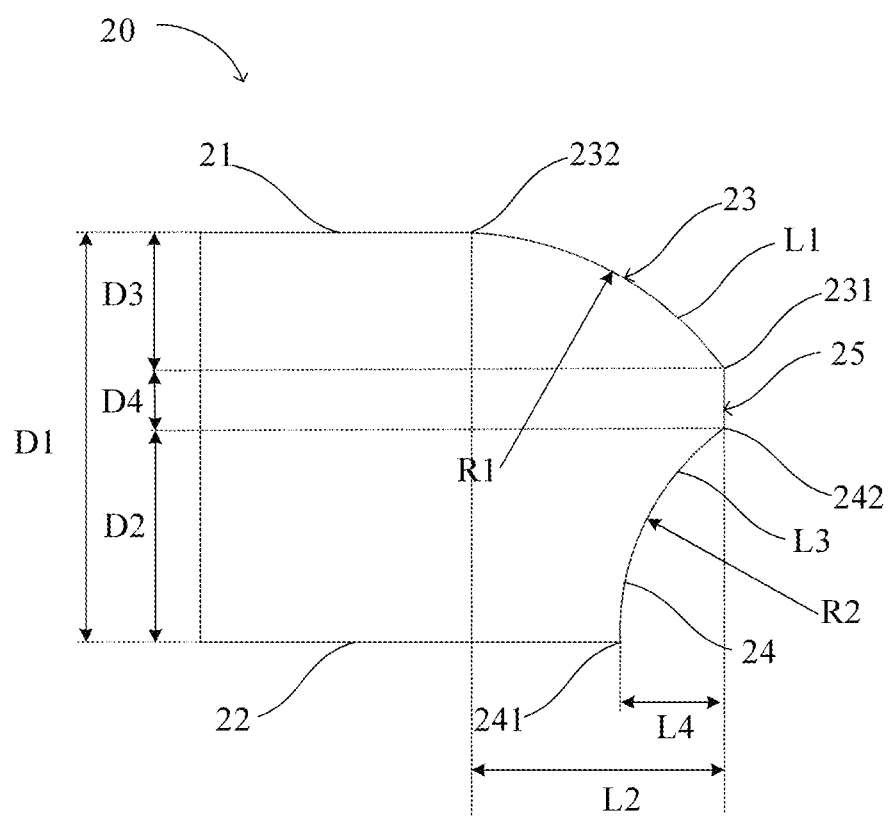
FIG. 8 is a partial cross-sectional view of an optical structure of the display screen of Example 2 of the present application.

FIG. 5 is a front view of a simulated luminance distribution diagram of the display screen 1 of this example. It can be seen from FIG. 5 that a user will substantially not be able to observe the seam 30 at the front-view angle, so that the seam 30 can be visually eliminated, the user's visual effect on splicing screens can be improved, achieving a subjective visual feeling for the user as if there was no seam 30.

Example 2

As shown in FIG. 6-FIG. 9, the overall structure of the display screen of this example is substantially the same as the structure in Example 1, except in that one end of the second surface 22 of the optical structure 20 close to the seam 30 is a second arc surface 24, and the light emitted from the display area 11 of the display module 10 is reflected by the second arc surface 24 to supplement the light in the non-front-view area corresponding to the seam 30.

It should be noted that the non-front-view area corresponding to the seam 30 refers to an area where the seam 30 is observed when a user watches the display module 10 from an angle other than the front view angle (that is, an angle that is not perpendicular to the display module 10, that is, an oblique view angle or a large view angle) in absence of an optical structure.

In this way, by providing the second arc surface 24, the light emitted from the display area 11 of the display module 10 can be reflected, and the light can be emitted through the first surface 21 of the light structure, so that the light can be supplemented for the non-front-view area corresponding to the seam 30. It can further visually eliminate the seam 30 for the non-front-view area corresponding to the seam 30, further improving the user's visual effect on a splicing screen, and achieving a subjective visual feeling for the user as if there was no seam 30.

Further, the second arc surface 24 is a concave arc surface configuration. Wherein, the concave arc surface configuration refers to that the arc surface is concave in a direction close to the center of the optical structure.

Specifically, a size L4 of an orthographic projection of the second arc surface 24 on the display module 10 along the width direction of the seam 30 is larger than or equal to one half of the width W of the seam 30, and smaller than or equal to one half of the width W of the seam 30 plus 0.5 mm, so as to cover the length of the seam from an oblique view angle.

The second arc surface 24 includes a third end 241 close to the display module 10 and a fourth end 242 away from the display module 10.

A distance D2 from the horizontal plane where the fourth end 242 is located to the horizontal plane where the third end 241 is located is larger than or equal to one half of the width W of the seam 30 plus 0.5 mm, and the larger the value of D2 is, the better the oblique view angle effect will be, but the larger thickness of the optical structure will increase the weight and material cost; therefore, the oblique angle and the thickness of the model should be traded off in the design, and the distance D2 from the horizontal plane where the fourth end 242 is located to the horizontal plane where the third end 241 is located is generally set to be larger than or equal to one half of the width of the seam and smaller than or equal to the thickness of the optical structure minus 1 mm.

A distance D4 between the end of the first arc surface 23 closest to the second surface 22 (the first end 231 of the first arc surface 23) and the end of the second arc surface 24 closest to the first surface 21 (the fourth end 242 of the second arc surface 24) is larger than zero. Preferably, the distance D4 between the first end 231 of the first arc surface 23 and the fourth end 242 of the second arc surface 24 is larger than or equal to 0.3 mm, and smaller than or equal to 1 mm to avoid sharp corners during assembly and scratches during operation, and facilitates the processing of materials. It should be noted that when a side edge 25 connected between the first surface 21 and the second surface 22 is perpendicular to the display module 10, a length of the side edge 25 is equal to the distance D4 between the first end 231 of the first arc surface 23 and the fourth end 242 of the second arc surface 24.

A radius R2 of the second arc surface 24 is 2 mm-8 mm. The smaller the value of the radius R2 of the second arc surface 24 is, the better the effect of oblique view angle will be, but the worse the effect of front view angle will be; and vice versa. Therefore, the effect of oblique view angle and the effect of front view angle should be traded of during design. When the value of the radius R2 of the second arc surface 24 is 2 mm-8 mm, the effects will be optimal. The arc length L3 of the second arc surface 24 is determined jointly from the size L4 of the orthographic projection of the second arc surface 24 on the display module 10 along the width direction of the seam 30, the distance D2 from the horizontal plane where the fourth end 242 is located to the horizontal plane where the third end 241 is located and the radius R2 of the second arc surface 24.

Figure 9:
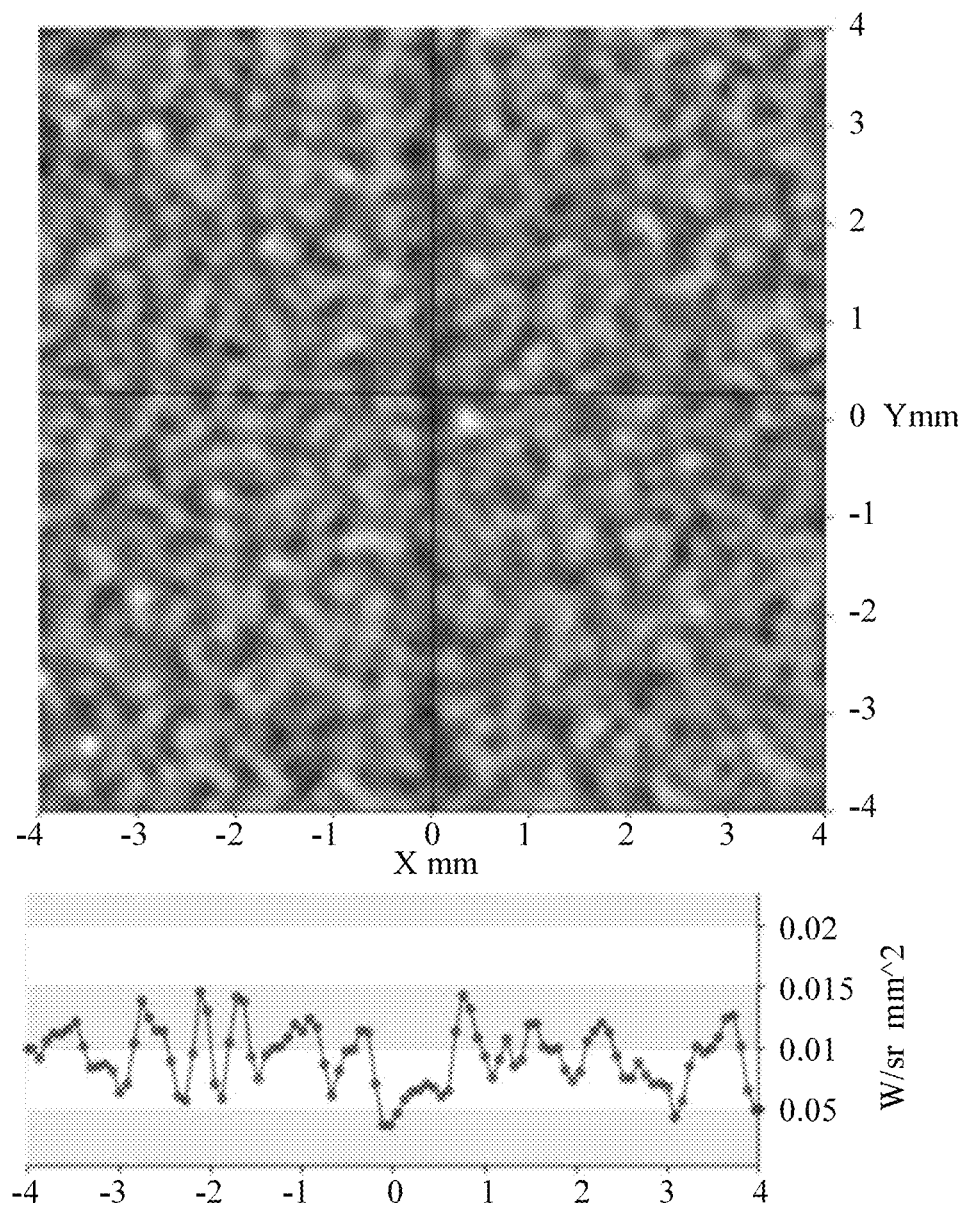
FIG. 9 is a front view of a simulated luminance distribution diagram of the display screen of Example 2 of the present application.

The end of the second surface 22 of the optical structure 20 close to the seam 30 in this example is a concave arc surface configuration. FIG. 9 is a simulated luminance distribution diagram of the display screen 1 of this example. It can be seen in FIG. 9 that, a user will substantially not be able to observe the seam 30 at the front view angle, which can visually eliminate the seam 30, improve the user's visual effect on splicing screens, and achieve a subjective visual feeling for the user as if there was no seam 30.

It should be noted that the end of the second surface 22 close to the seam 30 can also be in other structural forms, but it has different effects on the optical path of the oblique view angle.

Figure 10:
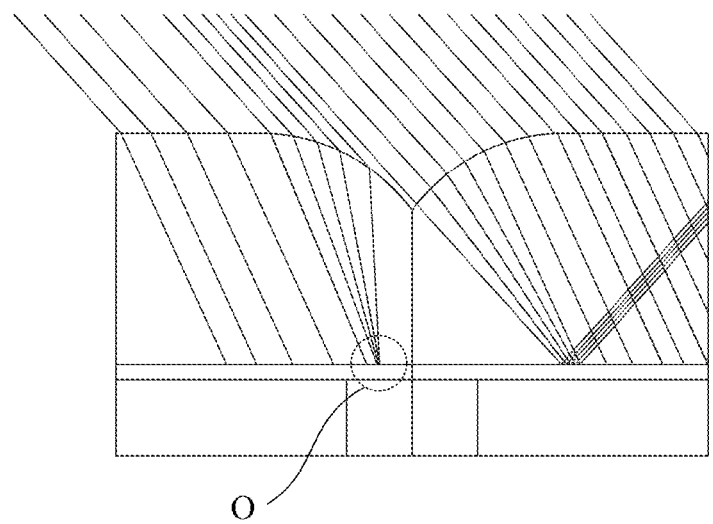
FIG. 10 is a 45-degree optical path diagram of the optical structure of the display screen of Example 1 of the present application.

As in the optical structure 20 in Example 1, when the second surface 22 is an integral flat plane, referring back to FIG. 5, the user can hardly observe the seam 30 from a front angle. However, as shown in FIG. 10, when watching the display module 10 at an oblique angle of 45 degrees, the user can observe the structure of part of the seam 30, that is, the part O in the figure. That is, for the optical structure 20 in Example 1, the seam 30 seen from a front view angle can be visually eliminated through the first arc surface 23, but the seam 30 seen by a user at an oblique view angle or a large view angle cannot be visually eliminated.

Figure 11:
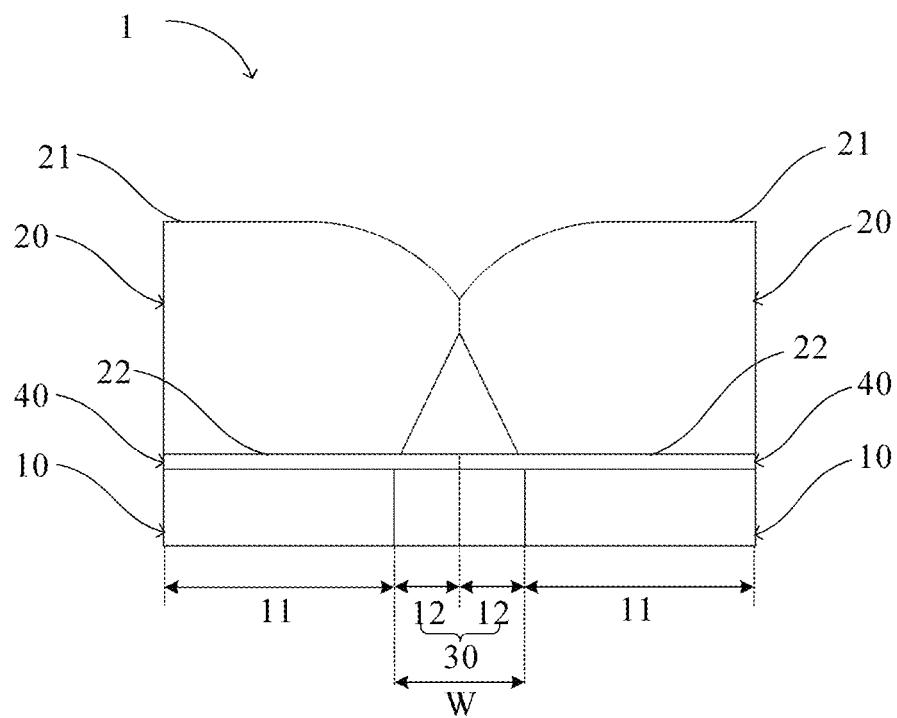
FIG. 11 is a schematic structural diagram of an optical structure of another implementation of the display screen of the present application.
Figure 12:
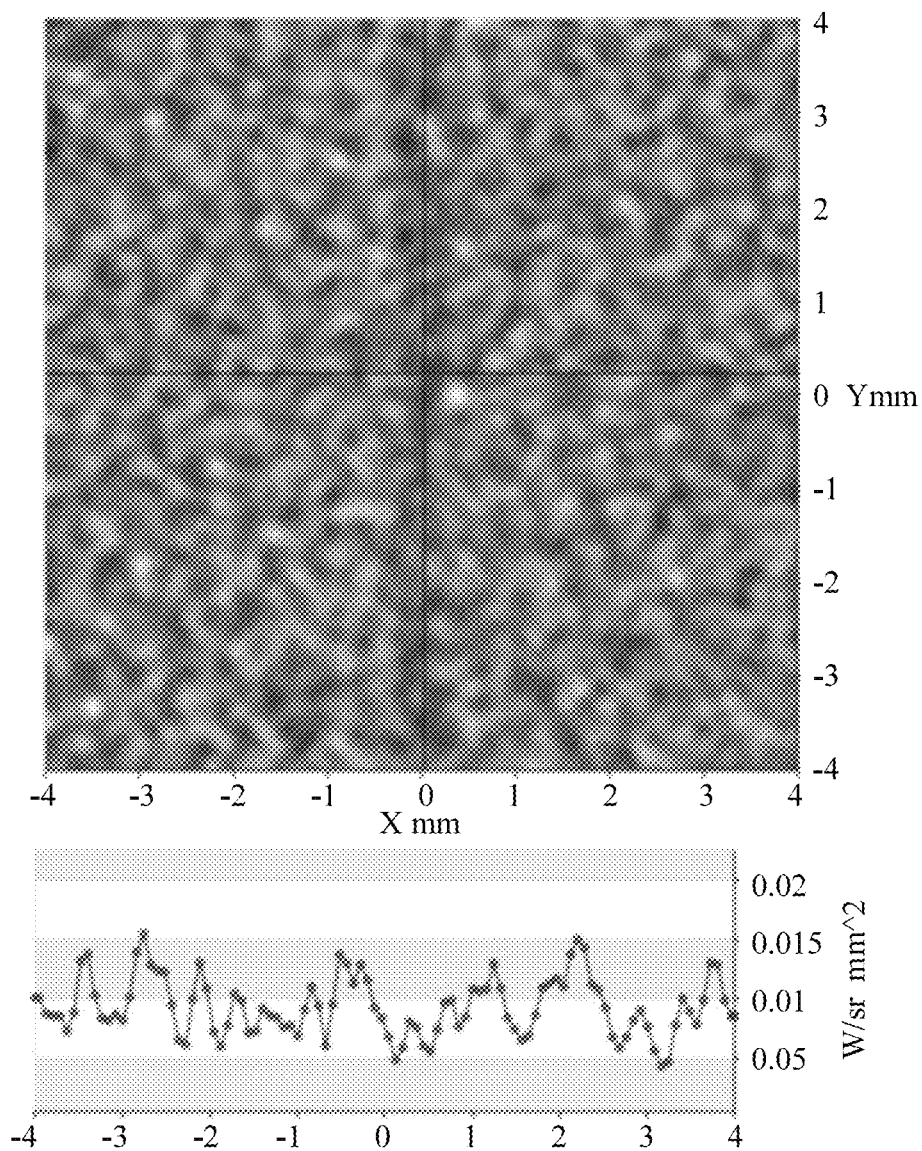
FIG. 12 is a front view of a simulated luminance distribution diagram of an optical structure of another implementation of the display screen of the present application.
Figure 13:
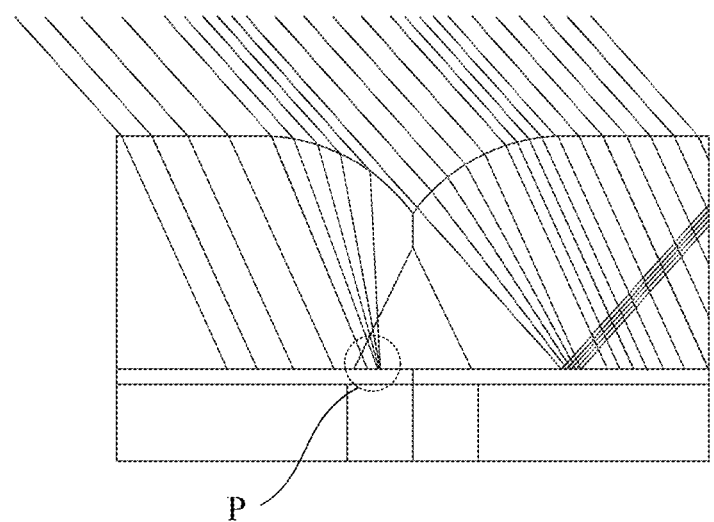
FIG. 13 is a 45-degree optical path diagram of an optical structure of another implementation of the display screen of the present application.

Similarly, in another example, as shown in FIG. 11, when the end of the second surface 22 of the optical structure 20 close to the seam 30 is a flat surface that forms a certain angle with the plane where the display module 10 is located, as shown in FIG. 12, the user will substantially not be able to observe the seam 30 at a front angle. However, as shown in FIG. 13, when the user watches the display module 10 at an oblique angle of 45 degrees, the structure of part of the seam 30 can also be observed, that is, the part P in the figure. That is, when the end of the second surface 22 close to the seam 30 is set as a flat plane with a certain angle formed with the plane where the display module 10 is located, only part of the light can be emitted out of the optical structure 20, to alleviate the problem that the user can see the seam 30 in oblique or large view angles, which effect is less than desirable.

Figure 14:
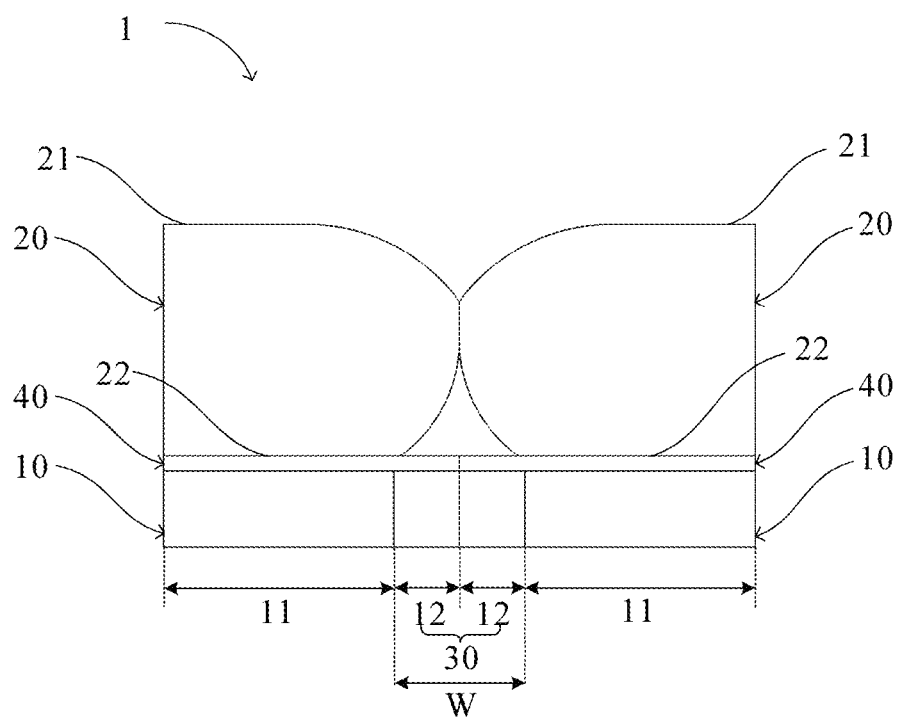
FIG. 14 is a schematic structural diagram of an optical structure of another implementation of the display screen of the present application.
Figure 15:
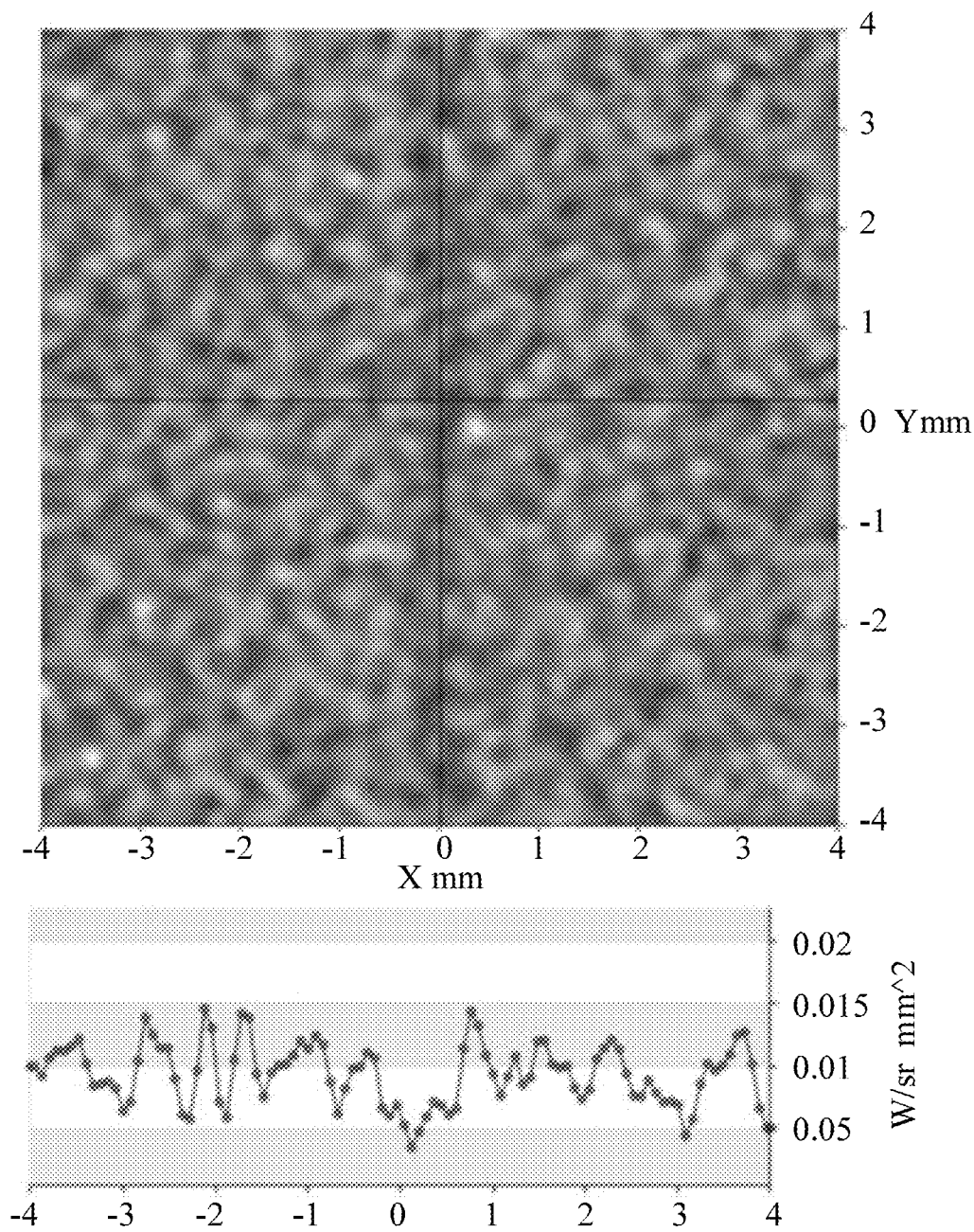
FIG. 15 is a front view of a simulated luminance distribution diagram of an optical structure of still another implementation of the display screen of the present application.
Figure 16:
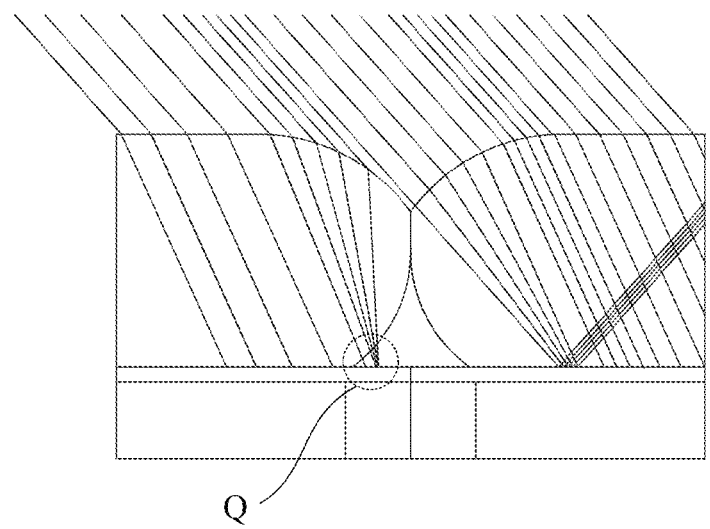
FIG. 16 is a 45-degree optical path diagram of an optical structure of still another implementation of the display screen of the present application.

In yet another example, as shown in FIG. 14, when the end of the second surface 22 of the optical structure 20 close to the seam 30 is a convex arc structure, as shown in FIG. 15, the user will substantially not be able to observe the seam 30 at a front angle. However, as shown in FIG. 16, when the user watches the display module 10 at an oblique angle of 45 degrees, the user can still observe a part of the structure of the seam 30, that is, the part Q in the figure. That is to say, when the end of the second surface 22 close to the seam 30 is provided as a convex arc structure, only a very small part of the light can be emitted out of the optical structure 20, to alleviate the problem that the user can see the seam 30 in oblique or large view angles, which effect is undesirable.

Figure 17:
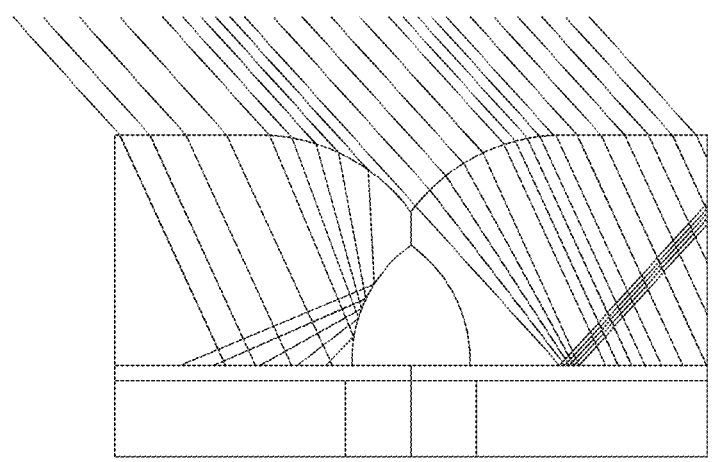
FIG. 17 is a 45-degree optical path diagram of an optical structure of the display screen of Example 2 of the present application.

Only with the configuration of Example 2 in which the end of the second surface 22 of the optical structure 20 close to the seam 30 is a concave arc structure, not only the user will substantially not be able to observe the seam 30 at a front angle (referring back to FIG. 9); but also, when the user watches the display module 10 at an oblique angle of 45 degrees (as shown in FIG. 17), the seam 30 cannot be observed at all. That is, when the end of the second surface 22 close to the seam 30 is configured as a concave arc structure, all light can exit the optical structure 20 to alleviate the problem that the user can see the seam 30 in a large view angle, which effect is desirable.

Through the above description, the optimal optical structure 2 can be obtained in which one end of the first surface 21 close to the seam 30 is a convex arc structure and one end of the second surface 22 close to the seam 30 is a concave arc structure. This can eliminate the seam from both the front view angle and the large view angle.

Example 3

Figure 18:
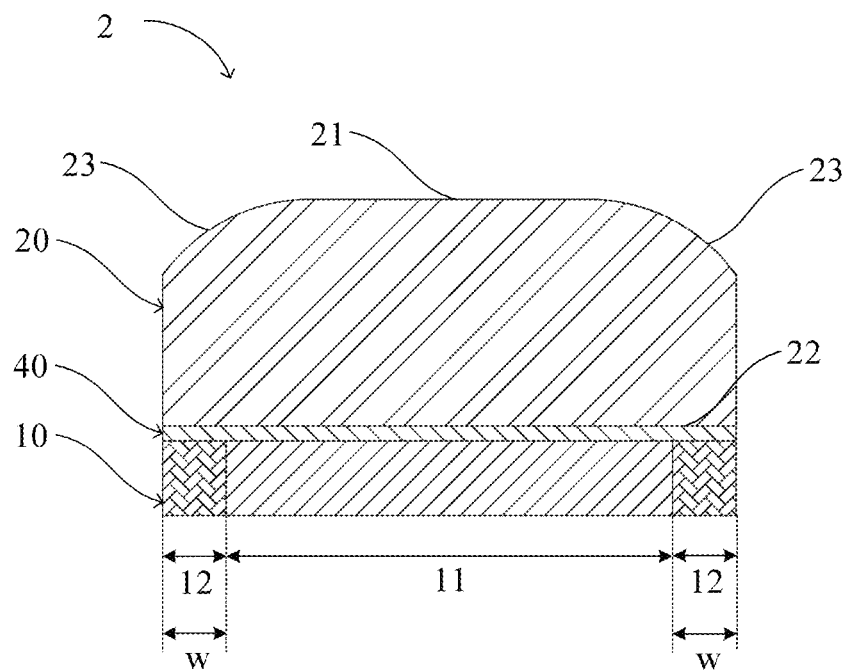
FIG. 18 is a schematic cross-sectional view of a splicing display unit of Example 3 of the present application.

As shown in FIG. 18, in this example, there is provided a splicing display unit 2. A plurality of splicing display units 2 are closely arranged to form the display screen in Example 1. That is, the splicing display unit 2 in this example is the smallest splicing unit of the display screen in Example 1.

The splicing display unit 2 includes a display module 10 and an optical structure 20, the display module and the optical structure being stacked together, and the optical structure 20 is arranged on one side of the light emitting surface of the display module 10. The configuration of the optical structure 20 of this example can be made to FIG. 4.

The display module 10 includes a display area 11 and a black edge area 12 arranged around the display area 11, that is, the display area 11 is located at the center of the display module 10, and the black edge area 12 is arranged around the display area 11, so as to be located at the edge of the display module 11. When a plurality of splicing display units 2 are closely arranged, the black edge areas 12 of adjacent two display modules 10 are spliced together to form the seam 30 of the display screen in Example 1.

Each of the optical structures 20 includes a first surface 21 and a second surface 22 disposed opposite to each other, and the second surface 22 of the optical structure 20 is attached to the display module 10.

One end of the first surface 21 of the optical structure 20 close to the black edge area 12 of the display module 10 is a first arc surface 23, and the first arc surface 23 is configured to refract the light emitted from the display area 11 of the display module 10, and then distribute the refracted light in the front-view area corresponding to the black edge area 12.

It should be noted that the front-view area corresponding to the black edge area 12 refers to that an area where the black edge area 12 is observed when a user watches the display module 10 from a front view angle (i.e., an angle perpendicular to the display module 10) in absence of an optical structure.

In this way, by providing the overall structure and providing the first arc surface 23 in the optical structure 20, the light emitted from the display area 11 of the display module 10 can be refracted and distributed in the front-view area corresponding to the black edge area 12, which can visually eliminate the black edge area 12, improve the user's visual effect on splicing screens, and achieve a subjective visual feeling for the user as if there was no black edge area 12. Specifically, the light is refracted by the first arc surface 23 of the optical structure 20, so that the display area 11 of the display module 10 is "enlarged" to the imaging surface, so as to achieve the visual effect as if the physical black edge area 12 of the display screen 1 was eliminated.

Further, a distance from the first arc surface 23 to the plane where the display module 10 is located gradually decreases from a direction away from the display module 10 to a direction close to the display module 10, and the first arc surface 23 is a convex arc surface configuration. The convex arc surface configuration refers to that the arc surface is convex in a direction away from the center of the optical structure.

That is to say, the first arc surface 23 extends from a plane where the first surface 21 is located toward a direction close to the display module 10 to form a convex arc surface configuration, thereby forming a structure similar to a convex lens, to implement refracting the light emitted from the display area 11 of the module 10 and distributing the refracted light in the front-view area corresponding to the black edge area 12. Further, by defining parameters of the structure of the convex lens, it is possible to make the optical path to be deviated from the incident light direction by a specific angle to achieve an effect of magnifying an image, thereby eliminating the black edge area 12 and improving the user experience.

In addition, compared with some optical structures 20 in the prior art that are formed by overlapping several groups of prism structures, and the technical solutions in which several groups of prism structures are arranged to translate the image to the area of the black edge area 12, the optical structure 20 of the display screen 1 of this example has an image magnification effect, which can be suitable for N*N splicing, and is a single structure, so as to avoid the change of the picture effect caused by offsets of multiple structures in assembling.

Specifically, as shown in FIG. 3, in order to more clearly show the arrangement of the first arc surface 23 in the optical structure 20, the cross section line in the figure is removed.

A size L2 of an orthographic projection of the first arc surface 23 on the display module 10 along the width direction of the black edge area 12 is larger than or equal to twice the width w of the black edge area 12, and smaller than or equal to twice the width w of the black edge area 12 plus 5 mm. The width w of the black edge area 12 is 0.44 mm-1.95 mm. By making the size L2 of the orthographic projection of the first arc surface 23 on the display module 10 along the width direction of the black edge area 12 to be larger than or equal to twice the width w of the black edge area 12, it is possible to block the black edge area 12, but if the size is too large, the effect of refraction will be reduced.

The first arc surface 23 includes a first end 231 close to the display module 10 and a second end 232 away from the display module 10. A distance D3 from a horizontal plane where the first end 231 of the first arc surface 23 is located to a horizontal plane where the second end 232 of the first arc surface 23 is located is smaller than or equal to one half of a thickness D1 of the optical structure 20. Within this range, the larger the value of the distance D3 from the horizontal plane where the first end 231 of the first arc surface 23 is located to the horizontal plane where the second end 232 of the first arc surface 23 is located, the better the refraction effect and the better the front view effect, but the larger thickness of the optical structure will increase the weight and material cost; which will be traded off during design. Preferably, the distance D3 from the horizontal plane where the first end 231 of the first arc surface 23 is located to the horizontal plane where the second end 232 of the first arc surface 23 is located is 2 mm-4 mm.

A radius R1 of the first arc surface 23 is larger than or equal to twice the width w of the black edge area 12, and smaller than or equal to twice the width w of the black edge area 12 plus 5 mm. Preferably, the radius R1 of the first arc surface 23 is 2 mm-5 mm.

The arc length L1 of the first arc surface 23 is defined collectively by the size L2 of the orthographic projection of the first arc surface 23 on the display module 10 along the width direction of the black edge area 12, the distance D3 from the horizontal plane where the first end 231 of the first arc surface 23 is located to the horizontal plane where the second end 232 of the first arc surface 23 is located and the radius R1 of the first arc surface 23. The larger the arc length L1 of the first arc surface 23 is, the larger the length of the seam that can be covered is, which can be designed based on the length of the seam.

In this example, a thickness D1 of the optical structure 20 is 3 mm-10 mm. The material of the optical structure 20 is glass, or PMMA (polymethyl methacrylate), or PC (polycarbonate). The optical structure 20 is fixed on the display module 10 through an optical adhesive layer 40.

In this example, the second surface 22 of the optical structure 20 in this example is an integral flat plane.

The splicing display unit 2 of the present example can visually eliminate the black edge area 12. The user's visual effect on splicing screens can be improved, achieving a subjective visual feeling for the user as if there was no black edge area 12.

Example 4

Figure 19:
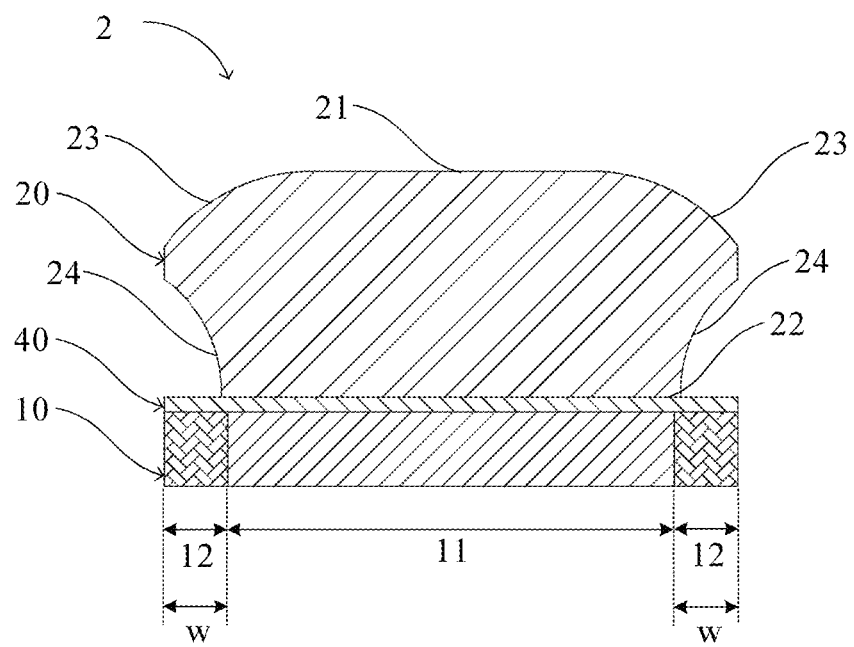
FIG. 19 is a schematic cross-sectional view of a splicing display unit of Example 4 of the present application.

As shown in FIG. 19, the overall structure of the splicing display unit of this example is substantially the same as the structure in Example 3, except in that one end of the second surface 22 of the optical structure 20 close to the black edge area 12 is a second arc surface 24, and the light emitted from the display area 11 of the display module 10 is reflected by the second arc surface 24 to supplement the light in the non-front-view area corresponding to the black edge area 12. The configuration of the optical structure 20 of this example can refer to FIG. 8.

It should be noted that the non-front-view area corresponding to the black edge area 12 refers to an area where the black edge area 12 is observed when a user watches the display module 10 from an angle other than the front view angle (that is, an angle that is not perpendicular to the display module 10, that is, an oblique view angle or a large view angle) in absence of an optical structure.

In this way, by providing the second arc surface 24, the light emitted from the display area 11 of the display module 10 can be reflected, and the light can be emitted through the first surface 21 of the light structure, so that the light can be supplemented for the non-front-view area corresponding to the black edge area 12. It can further visually eliminate the black edge area 12 for the non-front-view area corresponding to the black edge area 12, further improving the user's visual effect on a splicing screen, and achieving a subjective visual feeling for the user as if there was no black edge area 12.

Further, the second arc surface 24 is a concave arc surface configuration. Wherein, the concave arc surface configuration refers to that the arc surface is concave in a direction close to the center of the optical structure.

Specifically, a size L4 of an orthographic projection of the second arc surface 24 on the display module 10 along the width direction of the black edge area 12 is larger than or equal to the width w of the black edge area 12, and smaller than or equal to the width w of the black edge area 12 plus 0.5 mm, so as to cover the length of the seam from an oblique view angle.

The second arc surface 24 includes a third end 241 close to the display module 10 and a fourth end 242 away from the display module 10.

A distance D2 from the horizontal plane where the fourth end 242 is located to the horizontal plane where the third end 241 is located is larger than or equal to the width w of the black edge area 12 plus 0.5 mm, and the larger the value of D2 is, the better the oblique view angle effect will be, but the larger thickness of the optical structure will increase the weight and material cost; therefore, the oblique angle and the thickness of the model should be traded off in the design, and the distance D2 from the horizontal plane where the fourth end 242 is located to the horizontal plane where the third end 241 is located is generally set to be larger than or equal to the width w of the black edge area 12 and smaller than or equal to the thickness of the optical structure minus 1 mm.

A distance D4 between the end of the first arc surface 23 closest to the second surface 22 (the first end 231 of the first arc surface 23) and the end of the second arc surface 24 closest to the first surface 21 (the fourth end 242 of the second arc surface 24) is larger than zero. Preferably, the distance D4 between the first end 231 of the first arc surface 23 and the fourth end 242 of the second arc surface 24 is larger than or equal to 0.3 mm, and smaller than or equal to 1 mm to avoid sharp corners during assembly and scratches during operation, and facilitates the processing of materials. It should be noted that when a side edge 25 connected between the first surface 21 and the second surface 22 is perpendicular to the display module 10, a length of the side edge 25 is equal to the distance D4 between the first end 231 of the first arc surface 23 and the fourth end 242 of the second arc surface 24.

A radius R2 of the second arc surface 24 is 2 mm-8 mm. The smaller the value of the radius R2 of the second arc surface 24 is, the better the effect of oblique view angle will be, but the worse the effect of front view angle will be; and vice versa. Therefore, the effect of oblique view angle and the effect of front view angle should be traded of during design. When the value of the radius R2 of the second arc surface 24 is 2 mm-8 mm, the effects will be optimal. The arc length L3 of the second arc surface 24 is determined jointly from the size L4 of the orthographic projection of the second arc surface 24 on the display module 10 along the width direction of the black edge area 12, the distance D2 from the horizontal plane where the fourth end 242 is located to the horizontal plane where the third end 241 is located and the radius R2 of the second arc surface 24.

With the configuration of Example 2 in which the end of the second surface 22 of the optical structure 20 close to the black edge area 12 is a concave arc structure, not only the user will substantially not be able to observe the black edge area 12 at a front angle; but also, when the user watches the display module 10 at an oblique angle of 45 degrees, the black edge area 12 cannot be observed at all. That is, when the end of the second surface 22 close to the black edge area 12 is configured as a concave arc structure, all light can exit the optical structure 20 to alleviate the problem that the user can see the black edge area 12 in a large view angle, which effect is desirable.

The optical structure 2 can be obtained in which one end of the first surface 21 close to the black edge area 12 is a convex arc structure and one end of the second surface 22 close to the black edge area 12 is a concave arc structure. This can eliminate the seam from both the front view angle and the large view angle.

The above is only the preferred example of the application, and is not intended to limit the application. Within the spirit and principle of the application, any modification, equivalent replacement, improvement etc. made should fall within the scope of protection of this application.

The invention claimed is:

1. A display screen, comprising a plurality of display modules and a plurality of optical structures, wherein each optical structure of the optical structures is arranged corresponding to one display module of the display modules, and is arranged on a side of a light-emitting surface of the display module;
   each display module of the display modules comprises a display area and a black edge area arranged around the display area, black edge areas of adjacent two display modules among the display modules are spliced together to form a seam;
   the optical structure comprises a first surface and a second surface opposite to each other, and the second surface of the optical structure is attached to the display module;
   one end of the first surface of the optical structure at the seam is a first arc surface, and the first arc surface is configured to refract light emitted from the display area of the display module, and to distribute the refracted light in a front-view area corresponding to the seam;
   wherein one end of the second surface of the optical structure at the seam is a second arc surface, and light emitted from the display area of the display module is reflected by the second arc surface to supplement light in a non-front-view area corresponding to the seam.

2. The display screen of claim 1, wherein the first arc surface is a convex arc surface configuration.

3. The display screen of claim 1, wherein a size of an orthographic projection of the first arc surface on the display module along a width direction of the seam is larger than or equal to a width of the seam, and smaller than or equal to the width of the seam plus 5 mm, and the width of the seam is 0.88 mm-3.9 mm.

4. The display screen of claim 1, wherein the second arc surface is a concave arc surface configuration.

5. The display screen of claim 1, wherein the second arc surface comprises a third end close to the display module and a fourth end away from the display module; a distance from a horizontal plane where the fourth end is located to a horizontal plane where the third end is located is larger than or equal to one half of the width of the seam and smaller than or equal to the thickness of the optical structure minus 1 mm.

6. A splicing display unit, comprising a display module and an optical structure, the display module and the optical structure being stacked together, wherein the optical structure is arranged on one side of a light emitting surface of the display module;
   the display module comprises a display area and a black edge area arranged around the display area;
   the optical structure comprises a first surface and a second surface opposite to each other, and the second surface of the optical structure is attached to the display module;
   one end of the first surface of the optical structure at the black edge area of the display module is a first arc surface, and the first arc surface is configured to refract light emitted from the display area of the display module and to distribute the refracted light in a front-view area corresponding to the black edge area;
   wherein one end of the second surface of the optical structure at the seam is a second arc surface, and light emitted from the display area of the display module is reflected by the second arc surface to supplement light in an non-front-view area corresponding to the seam.

7. The splicing display unit of claim 6, wherein the first arc surface is a convex arc surface configuration.

8. The splicing display unit of claim 6, wherein a size of an orthographic projection of the first arc surface on the display module along a width direction of the black edge area is larger than or equal to twice a width of the black edge area and smaller than or equal to twice the width of the black edge area plus 5 mm, and the width of the black edge area is 0.44 mm-1.95 mm.

9. The splicing display unit of claim 6, wherein the second arc surface is a concave arc surface configuration.

10. The splicing display unit of claim 6, wherein the second arc surface comprises a third end close to the display module and a fourth end away from the display module; a distance from a horizontal plane where the fourth end is located to a horizontal plane where the third end is located is larger than or equal to the width of the black edge area and smaller than or equal to the thickness of the optical structure minus 1 mm, and the width of the black edge area is 0.44 mm-1.95 mm.

11. The display screen of claim 1, wherein a distance between one end of the first arc surface closest to the second surface and one end of the second arc surface closest to the first surface is larger than or equal to 0.3 mm, and smaller than or equal to 1 mm.

12. The display screen of claim 1, wherein a radius of the second arc surface is 2 mm-8 mm.

13. The display screen of claim 1, wherein the first arc surface comprises a first end close to the display module and a second end away from the display module; a distance from a horizontal plane where the first end of the first arc surface is located to a horizontal plane where the second end of the first arc surface is located is smaller than or equal to one half of a thickness of the optical structure.

14. The display screen of claim 1, wherein a radius of the first arc surface is larger than or equal to twice the width of the black edge area, and smaller than or equal to twice the width of the black edge area plus 5 mm, the width of the black edge area is 0.44 mm-1.95 mm; and/or, the radius of the first arc surface is 2 mm-5 mm; and/or a thickness of the optical structure is 3 mm-10 mm.

15. The splicing display unit of claim 6, wherein a distance between one end of the first arc surface closest to the second surface and one end of the second arc surface closest to the first surface is larger than or equal to 0.3 mm, and smaller than or equal to 1 mm.

16. The splicing display unit of claim 6, wherein a radius of the second arc surface is 2 mm-8 mm.

17. The splicing display unit of claim 6, wherein the first arc surface comprises a first end close to the display module and a second end away from the display module; a distance from a horizontal plane where the first end of the first arc surface is located to a horizontal plane where the second end of the first arc surface is located is smaller than or equal to one half of a thickness of the optical structure.

18. The splicing display unit of claim 6, wherein a radius of the first arc surface is larger than or equal to twice the width of the black edge area, and smaller than or equal to twice the width of the black edge area plus 5 mm, the width of the black edge area is 0.44 mm-1.95 mm; and/or the radius of the first arc surface is 2 mm-5 mm; and/or a thickness of the optical structure is 3 mm-10 mm.

\* \* \* \* \*